United States Patent [19]
Tanoi

[11] Patent Number: 5,430,335
[45] Date of Patent: Jul. 4, 1995

[54] SIMPLIFIED LOW-NOISE OUTPUT BUFFER CIRCUIT

[75] Inventor: Satoru Tanoi, Tokyo, Japan

[73] Assignee: Oki Electric Industry Co., Ltd., Tokyo, Japan

[21] Appl. No.: 159,766

[22] Filed: Nov. 29, 1993

Related U.S. Application Data

[63] Continuation of Ser. No. 874,362, Apr. 24, 1992, abandoned.

[30] Foreign Application Priority Data

May 15, 1991 [JP] Japan .................... 3-110396

[51] Int. Cl.$^6$ .................. H03K 5/12; H03K 19/20; H03K 5/00; H03K 17/687
[52] U.S. Cl. .................. 327/170; 327/108; 327/180; 327/185; 327/310; 327/312; 327/313; 327/379; 327/387; 327/391
[58] Field of Search .................. 307/263, 270, 443, 451, 307/571, 572, 573, 576, 579, 585, 542, 473, 548

[56] References Cited

U.S. PATENT DOCUMENTS

| | | |
|---|---|---|
| 4,567,378 | 1/1986 | Raver .................. 307/270 |
| 4,731,553 | 3/1988 | Van Lehn et al. .................. 307/443 |
| 4,806,794 | 2/1989 | Walters, Jr. .................. 307/451 |
| 4,818,901 | 4/1989 | Young et al. .................. 307/585 |
| 4,820,942 | 4/1989 | Chan .................. 307/542 |
| 4,963,774 | 10/1990 | Masuda .................. 307/585 |
| 5,025,182 | 6/1991 | Farmer .................. 307/585 |
| 5,111,076 | 5/1992 | Tarng .................. 307/451 |

FOREIGN PATENT DOCUMENTS

| | | |
|---|---|---|
| 0199374 | 10/1986 | European Pat. Off. ... H03K 19/094 |
| 0443435 | 8/1991 | European Pat. Off. ... H03K 19/003 |
| 216518 | 2/1987 | Japan .................. H03K 19/094 |
| 62-185407 | 1/1988 | Japan .................. H03K 4/00 |
| 3169115 | 10/1991 | Japan .................. H03K 5/02 |
| 2239997 | 7/1991 | United Kingdom ........ H03K 17/04 |

OTHER PUBLICATIONS

Satoru Tanoia, "Semiconductor Integrated Circuit with Low-Noise Output Buffers," U.S. patent application Ser. No. 07/869,257, filed Apr. 15, 1992, U.S. Pat. No. 5,237,213.

Primary Examiner—Timothy P. Callahan
Assistant Examiner—Trong Phan
Attorney, Agent, or Firm—Edward D. Manzo

[57] ABSTRACT

An output buffer circuit has a pull-up output transistor controlled by a first node and a pull-down output transistor controlled by a second node. The first node is coupled to the second node through a switching stage controlled by feedback from the output terminal. When the output buffer circuit is switched between the high and low output states, the switching stage is initially on, switches off shortly after the potential of the output terminal begins to change, then switches on again when the output terminal reaches a certain intermediate potential.

18 Claims, 5 Drawing Sheets

SIMPLIFIED LOW-NOISE OUTPUT BUFFER CIRCUIT

This is a continuation of application Ser. No. 07/874,362 filed on Apr. 24, 1992, now abandoned.

BACKGROUND OF THE INVENTION

This invention relates to an output buffer circuit, more particularly to an output buffer circuit with a simple circuit configuration and reduced switching noise.

Switching noise occurring on power supply and ground lines when an output buffer is switched between different states is a serious problem ill integrated circuits. The major cause of such noise is the abrupt charging or discharging of a capacitive output load to which the buffer is connected. A minor cause is direct flow of current from the power supply to ground through the buffer circuit at the instant of switching.

Prior-art solutions to this problem have not been entirely satisfactory. For example, Japanese Patent Application Kokai Publication No. 216518/1986 discloses a tri-state output buffer circuit with two field-effect output transistors, the gates of which are interconnected through a transmission gate that is switched on and off by a control signal. The transmission gate reduces switching noise by delaying the turn-on times of the output transistors, so that they are never both on simultaneously. This scheme eliminates the minor cause of the switching noise problem, but fails to address the major cause.

Reducing the dimensions of the transistors in the transmission gate so that the output transistors turn on more slowly is not a satisfactory solution. Aside from slowing the operation of the circuit, it solves the problem only up to a certain output load capacitance. For larger capacitive loads the problem of switching noise still remains, because the relevant output transistor still turns too quickly in relation to the Charge or discharge time of the capacitive output load.

Japanese Patent Application Kokai Publication No. 244124/1986 discloses an output buffer circuit having two or more pull-up output transistors coupled in parallel to the power supply, and two or more pull-down output transistors coupled in parallel to ground. The turn-on times of the transistors are staggered so as to reduce peak charge or discharge current, while providing sufficient current-driving ability after all pull-up or pull-down transistors have been turned on. The drawback of this scheme is the large number of circuit elements required, e.g. twenty-four transistors in the disclosed circuit, many having their drains connected directly to the output terminal and requiring large pattern areas to prevent such problems as latch-up. This scheme is accordingly inappropriate for gate arrays and other devices in which a large number of output buffers must fit into a restricted space.

SUMMARY OF THE INVENTION

It is accordingly an object of the present invention to reduce switching noise in output buffer circuits.

Another object of the present invention is to simplify the structure of output buffer circuits.

Yet another object of the invention is to improve the switching speed of output buffer circuits.

The invented output buffer circuit has an output terminal, a power supply terminal, and a ground terminal. The output terminal is coupled to the power supply terminal through first switch having a first control terminal, the coupling being responsive to input at the first control terminal. The output terminal is coupled to the ground terminal through second switch having a second control terminal, the coupling being responsive to input at the second control terminal. The first control terminal and second control terminal are mutually coupled through a third switch. The third switch is also coupled to the output terminal, and the mutual coupling of the first and second control terminals is responsive to the potential of the output terminal.

DETAILED DESCRIPTION OF THE INVENTION

Tri-state and totem-pole embodiments of the invented output buffer circuit will be described with reference to the attached drawings. The drawings are intended only to illustrate the invention; they do not restrict its scope, which should be determined solely from the appended claims.

Figure 1:
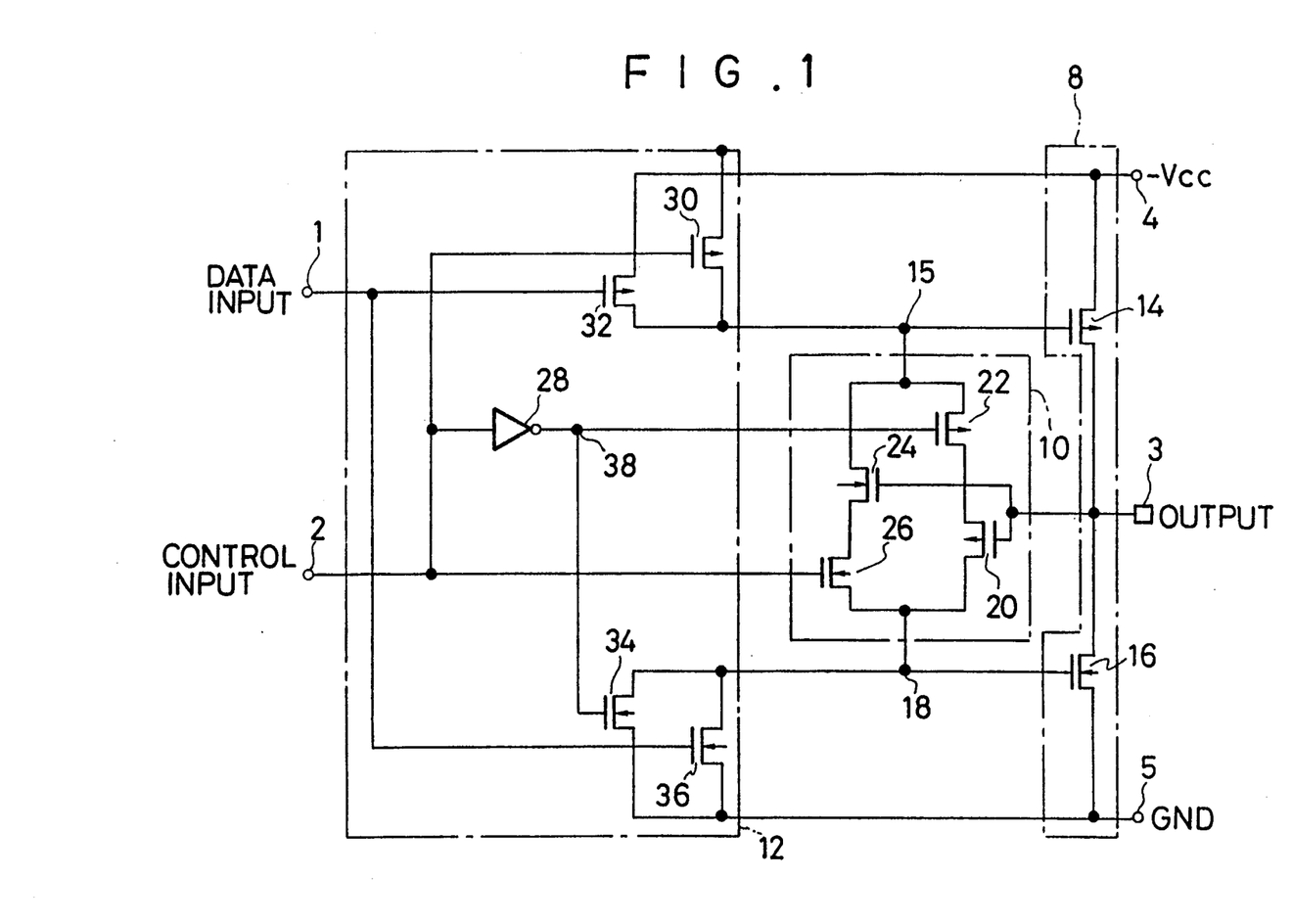
FIG. 1 is a schematic diagram of a novel tri-state output buffer circuit.

Referring to FIG. 1, a novel tri-state output buffer circuit has a data input terminal 1, a control input terminal 2, an output terminal 3, a power supply terminal 4, and a ground terminal 5. The power supply and ground terminals 4 and 5 are coupled to internal power supply and ground lines of an integrated circuit of which the output buffer circuit in FIG. 1 is a part. The power supply terminal 4 supplies a nominally constant power supply potential to the output buffer circuit; the ground terminal 5 supplies a nominally constant ground potential.

The conventional symbols $V_{CC}$ and GND will be used to denote the power supply and ground potentials. The terms "high" and "low" will also be used to refer to the power-supply and ground potentials, respectively. In the following descriptions a power-supply potential of five volts and ground potential of zero volts will be assumed, but the invention is of course not limited to these specific values.

The output buffer circuit in FIG. 1 is divided into three stages. A final output stage 8 directly drives the output terminal 3. A switching stage 10 (the semiconductor switching means referred to in the summary of the invention) turns on elements in the final stage 8. A control stage 12 controls the switching stage 10, and turns off elements in the final stage.

The final stage 8 comprises a pull-up output transistor and a pull-down output transistor. The pull-up output transistor is a p-channel metal-oxide-semiconductor field-effect output transistor 14 with a source electrode coupled to the power supply terminal 4, a gate electrode coupled to a first node 15, and a drain electrode coupled to the output terminal 3. The pull-down output transistor is and an n-channel metal-oxide-semiconductor field-effect output transistor 16 with a source electrode coupled to the ground terminal 5, a gate electrode coupled to a second node 18, and a drain electrode coupled to the output terminal 3.

For the sake of brevity, p-channel and n-channel metal-oxide-semiconductor field-effect transistors will be referred to below by the standard acronyms PMOS and NMOS, the word "electrode" will be omitted, and nodes will be identified only by their reference numerals.

The switching stage 10 has a pair of PMOS transistors 20 and 22 coupled in series between nodes 15 and 18. The source of the PMOS transistor 22 is coupled to node 15, the drain of the PMOS transistor 22 is coupled to the source of the PMOS transistor 20, and the drain of the PMOS transistor 20 is coupled to node 18. The gate of the PMOS transistor 20 is coupled to the output terminal 3. The gate of the PMOS transistor 22 is coupled to a node in the control stage 12 as described later.

The switching stage 10 also has a pair of NMOS transistors 24 and 26 coupled in series between nodes 15 and 18. The source of the NMOS transistor 26 is coupled to node 18, the drain of the NMOS transistor 26 is coupled to the source of the NMOS transistor 24, and the drain of the NMOS transistor 24 is coupled to node 15. The gate of the NMOS transistor 24 is coupled to the output terminal 3. The gate of the NMOS transistor 26 is coupled to the control input terminal 2.

The control stage 12 comprises an inverter 28, PMOS transistors 30 and 32, and NMOS transistors 34 and 36. The input of the inverter 28 is coupled to the control input terminal 2; the output of the inverter 28 is coupled to a node 38 which is coupled to the gate of the PMOS transistor 22 in the switching stage 10.

The sources of the PMOS transistors 30 and 32 are both coupled to the power supply terminal 4, and their drains are both coupled to node 15. The gate of the PMOS transistor 30 is coupled to the control input terminal 2. The gate of the PMOS transistor 32 is coupled to the data input terminal 1.

The sources of the NMOS transistors 34 and 36 are both coupled to the ground terminal 5, and their drains are both coupled to node 18. The gate of the NMOS transistor 34 is coupled to node 38. The gate of the NMOS transistor 36 is coupled to the data input terminal 1.

Figure 2:
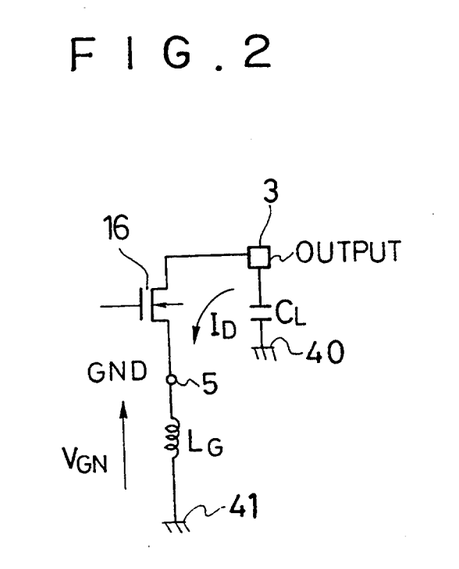
FIG. 2 is a partial redrawing of FIG. 1, illustrating a load capacitance and stray inductance.

Referring to FIG. 2, the output terminal 3 is coupled to a capacitive load, represented here as a capacitor $C_L$ disposed between the output terminal 3 and an external ground 40 such as a ground plane of a printed circuit board. The ground terminal 5 is coupled to a similar external ground 41, but there is a stray inductance $L_G$ between the ground terminal 5 and the external ground 41. Due to well-known inductive effects, when the capacitive load $C_L$ discharges through the NMOS output transistor 16 and ground terminal 5 to the external ground 41, the stray inductance $L_G$ generates a noise voltage $V_{GN}$ at the ground terminal 5.

This output buffer circuit operates in three states: a high output state in which the output terminal 3 is coupled to the power supply terminal 4, a low output state in which the output terminal 3 is coupled to the ground terminal 5, and a high-impedance state in which the output terminal 3 is coupled to neither of these terminals. When the control input terminal 2 is low, the output buffer circuit is in high-impedance state. When the control input terminal 2 is high, the output buffer circuit is in the high or low output state according to the state of the data input terminal 1. A description of the operation in these three states, and of switching among them, will be given next.

First the high-impedance state circuit will be described. If the control input terminal 2 is low, node 38 is high and the NMOS transistor 26 and PMOS transistor 22 in the switching stage 10 are both off, so the gates of the output transistors 14 and 16 are decoupled from one another. The NMOS transistor 34 and PMOS transistor 30 are on, so node 15 is high, which turns off the PMOS output transistor 14, and node 18 is low, which turns off the NMOS output transistor 16. The output terminal 3 is consequently in the high-impedance state, coupled to neither the power supply nor ground.

Next the operation in switching from the high-impedance state to the output state will be described. The description will refer to FIG. 3, which shows waveforms at the control input terminal 2, the data input terminal 1, nodes 15 and 18, the output terminal 3, and the power supply terminal 4. These waveforms were obtained by circuit simulation.

Figure 3:
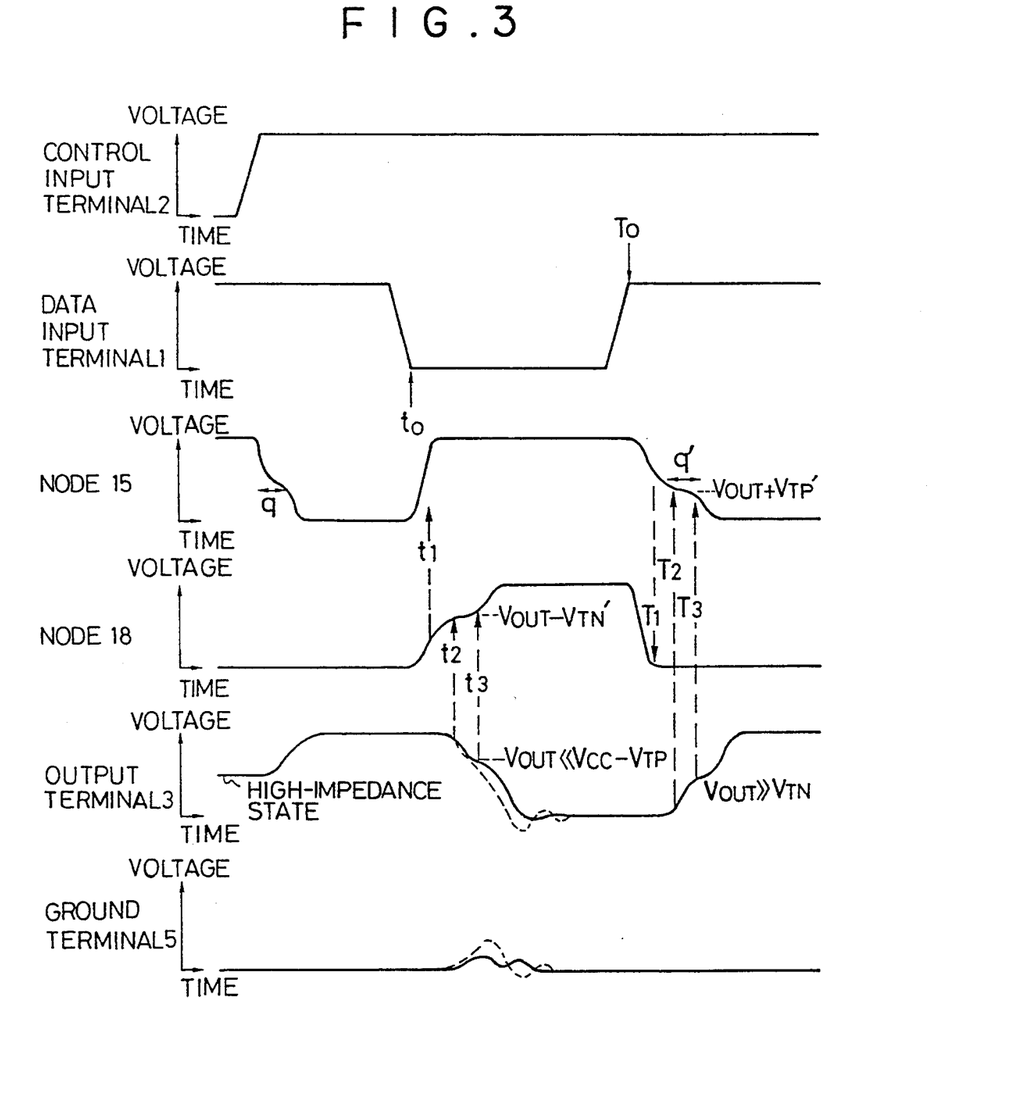
FIG. 3 is a waveform diagram illustrating the operation of the output buffer circuit in FIG. 1.

In FIG. 3, $V_{OUT}$ indicates the voltage of the output terminal 3. $V_{TN}$ and $V_{TP}$ are the gate-source threshold voltages of NMOS and PMOS transistors, respectively. $V_{TN}$ and $V_{TP}$ both have values of about 0.8 volts: if the source of an NMOS transistor is at the ground potential of zero volts, the transistor begins to conduct when its gate potential rises above 0.8 volts; if the source of a PMOS transistor is at the power supply potential of five volts, the transistor begins to conduct when its gate potential falls below 4.2 volts.

If the source potential of an NMOS transistor is higher than the ground potential, or the source potential of a PMOS transistor is lower than the power supply potential, $V_{TN}$ and $V_{TP}$ no longer apply. The reason is that PMOS transistors are formed in a substrate biased to the power supply potential, and NMOS transistors are disposed in grounded p-wells. The gate-source potential difference needed to turn on an NMOS transistor therefore increases as the source potential rises; similarly, the gate-source potential difference needed to turn on a PMOS transistor increases as its source potential falls. These increased threshold voltages are denoted $V_{TN}'$ and $V_{TP}'$ in the drawing.

Suppose now that the control input terminal 2 is originally low and the data input terminal 1 is originally high, as shown at the extreme left in FIG. 3. Node 15 is high and node 18 low as described above. The potential of the output terminal 3 depends on the state of its load $C_L$; a potential substantially midway between the high and low potentials is shown in FIG. 3, but the actual output potential may be any potential between $V_{CC}$ and GND.

If the control input terminal 2 changes from low to high, in the control stage 12, the PMOS transistor 30 and the NMOS transistor 34 turn off. Since the data input terminal 1 is high, the PMOS transistor 32 is off and the NMOS transistor 36 is on. Thus node 15 is decoupled from the power supply terminal 4, while node 18 remains coupled through the NMOS transistor 36 to the ground terminal 5.

In the switching stage 10, the PMOS transistor 22 and NMOS transistor 26 turn on. The source potential of the PMOS transistor 20 is therefore near $V_{CC}$ at the beginning of the interval q in FIG. 3 while the source potential of the NMOS transistor 24 is near GND. In view of the threshold voltages $V_{TP}$ and $V_{TN}$ described above, regardless of the potential $V_{OUT}$ of the output terminal 3, at least one of the two transistors 20 and 24 is on. A conducting path therefore exists through the switching stage 10.

Node 15 thus discharges through the switching stage 10 and NMOS transistor 36 to the ground terminal 5, and the potential of node 15 falls. In a certain interval, marked by the letter "q" in FIG. 3, the potential drop is temporarily slowed for a reason that will be explained later, but the potential of node 18 soon falls all the way to the ground level.

With nodes 15 and 18 both low, the NMOS output transistor 16 remains in the off state but the PMOS output transistor 14 turns on, coupling the output terminal 3 to the power supply terminal 4. The potential of the output terminal 3 rises to the high level. The output buffer is now in the high output state. In the switching stage 10 the PMOS transistor 20 switches off because $V_{OUT}$ is high, but the NMOS transistor 24 remains on.

Next the operation of output buffer in switching from the high output state to the low output state will be explained.

At time $t_0$ in FIG. 3 the data input terminal 1 is driven low. In the control stage 12, the NMOS transistor 36 turns off and the PMOS transistor 32 turns on, decoupling node 18 from the ground terminal 5 and coupling node 15 to the power supply terminal 4. The potential of node 15 promptly rises. At time $t_1$ node 15 reaches the high level, turning off the PMOS output transistor 14 and decoupling the output terminal 3 from the power supply terminal 4.

In the switching stage 10, although the PMOS transistor 20 is off, the NMOS transistors 24 and 26 are both on. Node 18 therefore charges from node 15 through the NMOS transistors 24 and 26, and the potential of node 18 also begins to rise.

As the potential of node 18 rises, however, so do the source potentials of the NMOS transistors 26 and 24 in the switching stage 10. The gate-source voltages of the NMOS transistors 26 and 24 are thus reduced, diminishing the conductivity of these transistors. Moreover, the threshold voltage $V_{TN}'$ increases as discussed above. At time $t_2$ the difference between the gate potential ($V_{OUT}$) of the NMOS transistor 24 and its source potential (the potential of node 18) no longer exceeds $V_{TN}'$, and the NMOS transistor 24 turns off. This temporarily halts the potential rise of node 18 at the value of $V_{OUT}-V_{TN}'$ at time $t_2$, which is about three volts.

This value is high enough to turn on the NMOS output transistor 16, the threshold value of which is $V_{TN}$ (0.8 V). $V_{OUT}$ therefore begins to fall as the capacitive load of the output terminal 3 discharges to the ground terminal 5. The discharge begins even before time $t_2$. As long as node 18 remains at three volts, however, the rate of discharge is limited to the drain current the NMOS output transistor 16 at this gate potential, which is only about half the drain current at the full gate potential of $V_{CC}$.

When the output voltage $V_{OUT}$ falls below $V_{CC}-V_{TP}$ the PMOS transistor 20 in the switching circuit 10 turns on and allows node 18 to resume charging. At first negligible charge current flows, but as $V_{OUT}$ falls further the conductivity of the PMOS transistor 20 increases, allowing more charge current to flow. The resulting slight rise in potential of node 18 increases the conductivity of the NMOS output transistor 16, accelerating the fall of $V_{OUT}$. These effects reinforce one another, and at time $t_3$ in FIG. 3, when $V_{OUT}$ is considerably lower than $V_{CC}-V_{TP}$, the potential of node 18 begins to rise again at an appreciable rate. This time the potential of node 18 rises all the way to the $V_{CC}$, while the potential $V_{OUT}$ of the output terminal 3 falls to the ground level.

The output buffer circuit is now in the low output state. In the final stage 8 the NMOS transistor 16 is fully turned on, its gate potential being $V_{CC}$. In the switching stage 10 the NMOS transistor 24 is off, but the PMOS transistors 20 and 22 are both on, holding node 18 at $V_{CC}$.

The bottom waveform in FIG. 3 shows the potential of the ground terminal 5. As mentioned earlier, discharge current from the output terminal 3 induces ground noise. The peak discharge current, however, occurs between times $t_2$ and $t_3$, shortly after the discharge begins, when the gate potential of the NMOS output transistor 16 is being held at an intermediate value of about three volts. Current flow is accordingly restricted, and the induced ground noise level is low.

The solid lines in FIG. 3 indicate $V_{OUT}$ and ground noise waveforms for the invented circuit in FIG. 1. The dashed lines indicate waveforms for a prior-art circuit. It can be seen that ground noise in the invented circuit is only about half that in the prior art.

Figure 4:
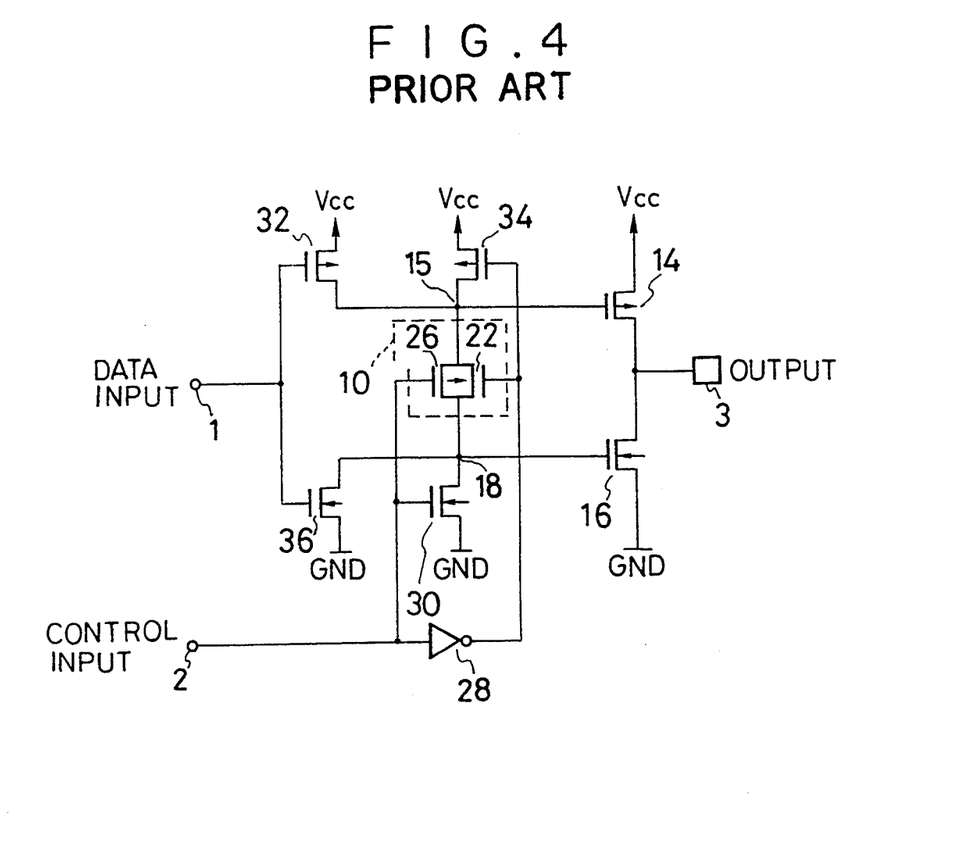
FIG. 4 is a schematic diagram of a prior-art output buffer circuit.

The prior-art circuit from which these dashed waveforms were obtained is illustrated in FIG. 4. This is the circuit disclosed in Japanese Patent Application Kokai Publication No. 216518/1986, cited above. Elements corresponding to elements in FIG. 1 are denoted by the same reference numerals.

The main difference between this prior-art circuit and the invented circuit is that in the prior-art circuit, the switching stage 10 is not coupled to the output terminal 3 and has no elements controlled by the output voltage $V_{OUT}$. In the output state, one or the other of the transistors 22 and 26 in the switching stage 10 is always turned on. Thus in switching from the high output state to the low output state, for example, the potential rise of node 18 is not checked at an intermediate point but proceeds at a steady rate. The corresponding uninterrupted rise in the conductivity of the output transistor to rise allows a larger peak discharge current to flow from the output terminal 3 to ground, producing a larger peak noise voltage at the ground terminal.

Figure 5:
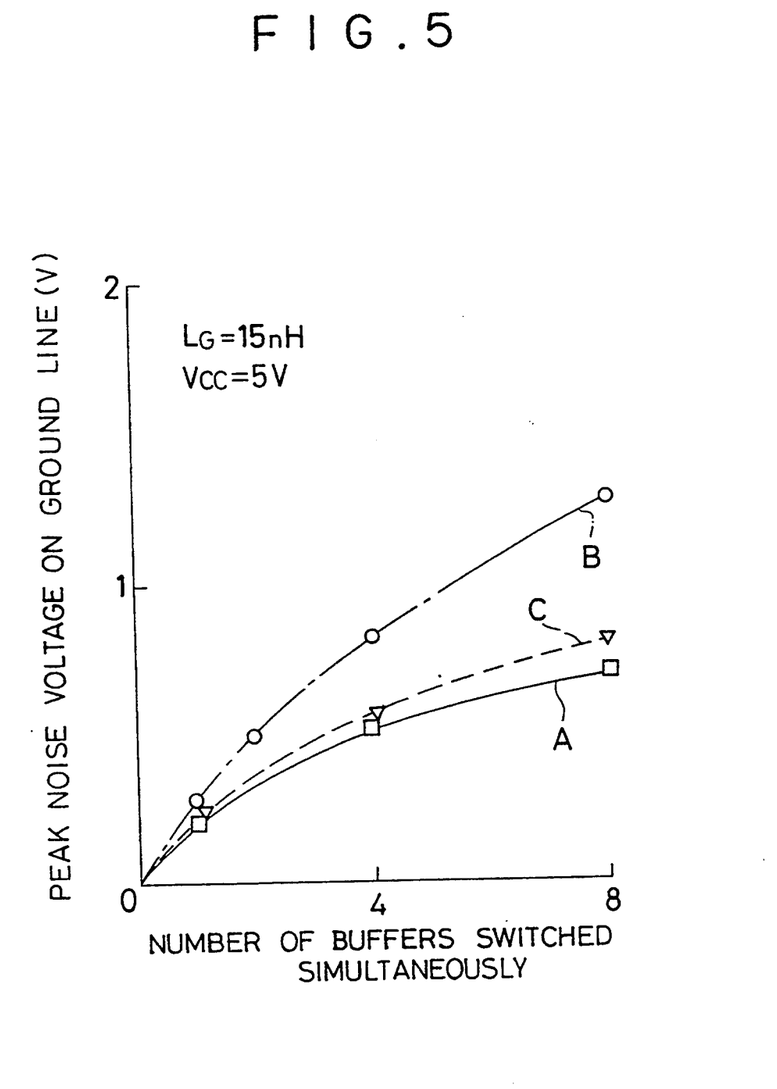
FIG. 5 is a graph of peak ground noise voltages in novel and prior-art output buffer circuits.

FIG. 5 illustrates peak ground noise voltages when one, two, four, and eight output buffers, all connected to the same ground line, are switched simultaneously from the high to the low output state. Curve A is for the invented circuit. Curve B is for the prior-art circuit in FIG. 4. Curve C is for the prior-art output buffer circuit disclosed in Japanese Patent Application Kokai Publication No. 244124/1986. The values in this graph were obtained by circuit simulation under identical conditions for all three circuits. All control transistors had the same dimensions, and output transistors were designed to assure an output low voltage ($V_{OL}$) of 0.4 V or less while sinking an output current ($I_{OL}$) of 24 mA. A stray ground inductance $L_G$ of 15 nH was assumed for all three circuits.

As FIG. 5 shows, the invented circuit produces much less ground noise than in curve B, and also produces slightly less ground noise than in curve C, despite the fact that curve C comes from a complex circuit having twenty-four transistors while the invented circuit has only twelve transistors. (The inverter 28 in FIG. 1 comprises two transistors.)

Referring again to FIG. 3, the invented circuit is similarly effective in reducing power supply noise during switching from the low to the high output state. If the data input terminal 1 is driven high at time $T_O$, the PMOS transistor 32 turns off and the NMOS transistor 36 turns on, decoupling node 15 from the power supply terminal 4 and coupling node 18 to the ground terminal 5. Node 18 falls promptly to ground level at time $T_1$, turning off the NMOS output transistor 16.

The potential of node 15 now falls by a process analogous to that detailed earlier. At time $T_2$ the PMOS transistor 20 in the switching stage 10 turns off, temporarily halting the potential drop of node 15 near the value of $V_{OUT}+V_{TP}'$, which is about 3.5 V. This value is low enough to turn on the PMOS output transistor 14, so the capacitive load of the output terminal 3 begins to charge and $V_{OUT}$ begins to rise. The rise of $V_{OUT}$ turns on the NMOS transistor 24 in the switching stage 10, however, and at time $T_3$ the potential of node 15 begins to fall again at an appreciable rate. In the final state node 15 is at the ground potential, so the PMOS output transistor 14 has its full current driving ability, while $V_{OUT}$ is high.

Although not shown in FIG. 3, noise at the power supply terminal 4 generated by the switch from the low output state to the high output state is reduced in the same way that ground noise was reduced before. Charge current in the interval q' from time $T_2$ to time $T_3$ is limited because the gate potential of the PMOS output transistor 14 is being held at an intermediate value. The induced noise voltage is correspondingly small.

The same restriction operated during the switching from the high-impedance state to the output state in the interval "q" in FIG. 3, reducing noise at that time too.

The invented output buffer circuit thus deals with the major cause of switching noise, which was excessive flow charge or discharge current. The invented circuit succeeds in restricting peak current flow even in the case of extremely large capacitive output loads, because the switching stage 10 is controlled by direct feedback from the output terminal 3. Regardless of the capacitance of the load, the switching stage 10 switches off and holds the gate of the output transistor 14 or 16 at an intermediate potential until the potential of the output terminal 3 has itself risen or fallen to an intermediate value. Current flow is therefore restricted until the interval of peak charge or discharge current flow has passed.

Another advantage of the invention is that when this interval has passed, the switching stage 10 promptly switches on again so that the output transistor can quickly finish turning on. Because of the feedback from the output terminal, the circuit can be easily designed so that intervals such as q and q' in FIG. 3 have the minimum length necessary for noise reduction. The circuit can moreover be optimized for minimum switching time at different capacitive loads, a feature not found in the prior art. The invented circuit can accordingly be expected to operate faster than other low-noise output buffer circuits.

As is also clear from FIG. 3, in switching from high to low output, the NMOS transistor 16 does not begin to switch on until the PMOS output transistor 14 has already switched off (node 18 does not rise appreciably until node 15 has already fallen to ground level). Similarly, in switching from low to high output, the PMOS transistor 14 does not begin to switch on until the NMOS output transistor 16 has already switched off (node 15 does not fall appreciably until node 18 has already reached $V_{CC}$). Accordingly, current never flows directly from the power supply terminal 4 to the ground terminal 5 through the output buffer circuit, eliminating a second source of noise.

Figure 6:
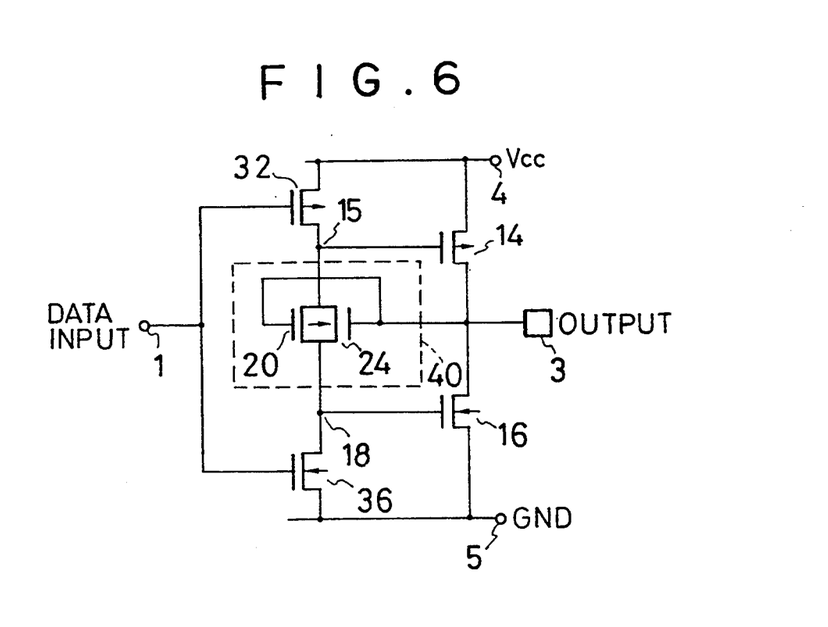
FIG. 6 is a schematic diagram of a novel totem-pole output buffer circuit.

FIG. 6 shows a novel totem-pole output buffer circuit that employs a subset of the circuit elements In FIG. 1. The same reference numerals are used. The data input terminal 1, output terminal 3, power supply terminal 4, ground terminal 5, PMOS transistors 14 and 32, and NMOS transistors 16 and 36 are interconnected in the same way as in FIG. 1. The switching stage 40 in FIG. 6 comprises only the PMOS transistor 20 and NMOS transistor 24, which are coupled in parallel between nodes 15 and 18. The gates of both of these transistors are coupled to the output terminal 3, as they were in FIG. 1.

This output buffer circuit differs from the one in FIG. 1 in having no control input terminal 2, and in lacking the transistors and inverter that were driven by the control input terminal 2 in FIG. 1. When the control input terminal 2 in FIG. 1 is high, the transistors 30 and 34, which are coupled in parallel with the transistors 32 and 36, can be ignored because they are switched off. The transistors 22 and 26, which are coupled in series with the transistors 20 and 24, can be ignored because they are switched on. FIG. 1 then becomes functionally equivalent to FIG. 6.

The output buffer circuit in FIG. 6 accordingly has only two states: a high output state and a low output state. The operation of this circuit in switching between these two states is identical to the operation of the circuit in FIG. 1 in switching between the high and low output states, so further description will be omitted. The benefits of the invention are the same as before: peak charge or discharge current to or from the output load is restricted, reducing noise at the power supply and ground terminals; flow of current directly from the power supply terminal 4 to the ground terminal 5 is prevented; switching time can be optimized for different load capacitances; and all this is accomplished with a small number of transistors (only six).

There are many other ways in which the invention can be embodied. For example, instead of using PMOS and NMOS transistors as in FIGS. 1 and 6, the invention can be practiced with other semiconductor elements. The necessary modifications will be apparent to those skilled in the art, and can be made without departing from the spirit and scope of the invention as set forth in the following claims.

What is claimed is:

1. An output buffer circuit coupled to a first potential terminal and a second potential terminal, the output buffer circuit having a data input terminal for receiving a data signal, a control input terminal for receiving a control signal and an output terminal for receiving an output signal, the output buffer circuit comprising:
   a first buffer circuit coupled to the first and second potential terminals and the output terminal, the first buffer circuit having first and second input terminals for receiving first and second signals;
   a second buffer circuit coupled to the data input terminal, the first and second potential terminals and the first and second input terminals, the second buffer circuit electrically coupling either one of the first potential terminal and the first input terminal together and the second potential terminal and the second input terminal together in response to the data signal;

a first control circuit coupled to the control input terminal, the output terminal and the first and second input terminals, the first control circuit electrically coupling the first and second input terminals in response to the control signal and the output signal; and a second control circuit coupled to the control input terminal, the first and second potential terminals and the first and second input terminals, the second control circuit electrically coupling either one of the potential terminal and the first input terminal together and the second potential terminal and the second input terminal together in response to the control signal;

said first buffer circuit comprising:

a first transistor having a first electrode as a source coupled to the first potential terminal, a second electrode as a drain coupled to the output terminal and a control electrode as a gate coupled to the first input terminal; and a second transistor having a first electrode as a source coupled to the second potential terminal, a second electrode as a drain coupled to the output terminal and a control electrode as a gate coupled to the second input terminal; and said first control circuit comprising:

a third transistor having a first electrode as a source, a second electrode as a drain and a control electrode as a gate coupled to said output terminal, said third transistor being coupled between said first input terminal and said second input terminal; and a fourth transistor having a first electrode as a source, a second electrode as a drain and a control electrode as a gate coupled to said output terminal, said fourth transistor being coupled between said first input terminal and said second input terminal in parallel with said third transistor;

wherein said first transistor begins to conduct when a gate-source voltage of said first transistor rises above a gate-source threshold voltage of said first transistor, and when the gate-source voltage of said first transistor is reduced, conductivity of said first transistor is diminished;

wherein said second transistor begins to conduct when a gate-source voltage of said second transistor rises above a gate-source threshold voltage of said second transistor, and when the gate-source voltage of said second transistor is reduced, conductivity of said second transistor is diminished;

wherein said third transistor begins to conduct when a gate-source voltage of said third transistor rises above a gate-source threshold voltage of said third transistor, and when the gate-source voltage of said third transistor is reduced, conductivity of said third transistor is diminished; and wherein said fourth transistor begins to conduct when a gate-source voltage of said fourth transistor rises above a gate-source voltage of said fourth transistor rises above a gate-source threshold voltage of said fourth transistor, and when the gate-source voltage of said fourth transistor is reduced, conductivity of said fourth transistor is diminished.

2. An output buffer circuit according to claim 1 wherein said second buffer circuit comprises:

a fifth transistor having a first electrode coupled to the first potential terminal, a second electrode coupled to the first input terminal and a control electrode coupled to the data input terminal, and a sixth transistor having a first electrode coupled to the second potential terminal, a second electrode coupled to the second input terminal and a control electrode coupled to the data input terminal.

3. An output buffer circuit according to claim 1 wherein said first control circuit comprises:

a seventh transistor having a first electrode coupled to the first input terminal, a second electrode and a control electrode coupled to the control input terminal, an eighth transistor having a first electrode coupled to the second input terminal, a second electrode and a control electrode coupled to the control input terminal.

4. An output buffer circuit according to claim 1 wherein said second control circuit comprises:

a ninth transistor having a first electrode coupled to the first potential terminal, a second electrode coupled to the first input terminal and a control electrode coupled to the control input terminal; and a tenth transistor having a first electrode coupled to the second potential terminal, a second electrode coupled to the second input terminal and a control electrode coupled to the control input terminal.

5. A output buffer circuit comprising:

a high potential terminal for receiving a high potential;

a low potential terminal for receiving a low potential;

a data input terminal for receiving an input signal;

a control circuit connected to said data input terminal for generating first and second inputs in response to said input signal;

an output terminal for outputting an output potential;

a first switch having a source, a drain and a gate as a first control terminal, for coupling said output terminal to said high potential terminal in response to said first input received at said first control terminal;

a second switch having a source, a drain, and a gate as a second control terminal, for coupling said output terminal to said low potential terminal in response to said second input received at said second control terminal; and a switching stage coupled to said output terminal, said first control terminal and said second control terminal, for coupling said first control terminal to said second control terminal in response to said output potential, said switching stage having a third switch having a source, a drain and a gate as a third control terminal coupled to said output terminal, said third switch being coupled between said first control terminal and said second control terminal, and a fourth switch having a source, a drain and a gate as a fourth control terminal coupled to said output terminal, said fourth switch being coupled between said first control terminal and said second control terminal in parallel with said third switch;

wherein said first switch begins to conduct when a gate voltage of said first switch falls a gate-source threshold voltage below the source voltage of said first switch, and when the gate-source voltage of said first switch is reduced, conductivity of said first switch is diminished;

wherein said second switch begins to conduct when a gate-source voltage of said second switch rises above a gate-source threshold voltage of said second switch, and when the gate-source voltage of said second switch is reduced, conductivity of said second switch is diminished;

wherein said third switch beings to conduct when a gate voltage of said third switch falls a gate-source threshold voltage below the source voltage of said third switch, and when the gate-source voltage of said third switch is reduced, conductivity of said third switch is diminished; and wherein said fourth switch begins to conduct when a gate-source voltage of said fourth switch rises above a gate-source threshold voltage of said fourth switch, and when the gate-source voltage of said fourth switch is reduced, conductivity of said fourth switch is diminished.

6. The output buffer circuit of claim 5, wherein said first switch is a PMOS transistor, the source of said first switch is coupled to said high potential terminal, and the drain of said first switch is coupled to said output terminal;

said second switch is an NMOS transistor, the source of said second switch is coupled to said low potential terminal, and the drain of said second switch is coupled to said output terminal;

said third switch is a PMOS transistor, the source of said third switch is coupled to said first control terminal, and the drain of said third switch is coupled to said second control terminal; and said fourth switch is an NMOS transistor, the source of said fourth switch is coupled to said second control terminal, and the drain of said fourth switch is coupled to said first control terminal.

7. The output buffer circuit of claim 6, wherein the gate-source threshold voltage needed to turn on said PMOS transistors increases as the source potential falls, and the gate-source threshold voltage needed to turn on said NMOS transistors increases as the source potential rises.

8. The output buffer circuit of claim 5 further comprising:

a control input terminal;

wherein said switching stage further includes:

a fifth switch coupled in series with said third switch and in parallel with said fourth switch between said first control terminal and said second control terminal, having a fifth control terminal coupled to said control input terminal; and a sixth switch coupled in series with said fourth switch and in parallel with said third switch between said first control terminal and said second control terminal, having a sixth control terminal coupled to said control input terminal.

9. The output buffer circuit of claim 8, wherein:

said fifth switch is a PMOS transistor having a source, a drain and a gate as the fifth control terminal, the source of said fifth switch is coupled to said first control terminal, and the drain of said fifth switch is coupled to said second control terminal via said third switch; and said sixth switch is an NMOS transistor having a source, a drain and a gate as the sixth control terminal, the source of said sixth switch is coupled to said second control terminal, and the drain of said sixth switch is coupled to said first control terminal via said fourth switch.

10. The circuit of claim 5, also comprising:

a seventh switch having a seventh control terminal coupled to said control input terminal, for coupling said first control terminal to said high potential terminal in response to input at said seventh control terminal; and an eighth switch having an eighth control terminal coupled to said control input terminal, for coupling said second control terminal to said low potential terminal in response to input at said eighth control terminal.

11. The circuit of claim 10, wherein said seventh switch is a PMOS transistor having a gate electrode as said seventh control terminal, and said eighth switch is an NMOS transistor having a gate electrode as said eighth control terminal, also comprising inverter coupled in series between said eighth control terminal and said control input terminal.

12. The circuit of claim 5, also comprising:

a ninth switch having a ninth control terminal coupled to said data input terminal, for coupling said first control terminal to said high potential terminal in response to input at said ninth control terminal; and an tenth switch having a tenth control terminal coupled to said data input terminal, for coupling said second control terminal to said low potential terminal in response to input at said tenth control terminal.

13. The circuit of claim 10, wherein said ninth switch is a PMOS transistor having a gate electrode as said ninth control terminal, and said tenth switch is an NMOS transistor having a gate electrode as said tenth control terminal.

14. A output buffer circuit comprising:

high potential terminal for receiving a high potential;

low potential terminal for receiving a low potential;

data input terminal for receiving an input signal;

a control circuit connected to said data input terminal for generating first and second inputs in response to said input signal;

an output terminal for outputting an output potential;

a first switch as a PMOS transistor having a source, a drain and a gate as a first control terminal, for coupling said output terminal to said high potential terminal in response to said first input received at said first control terminal;

a second switch as an NMOS transistor having a source, a drain and a gate as a second control terminal, for coupling said output terminal to said low potential terminal in response to said second input received at said second control terminal; and a switching stage coupled to said output terminal, said first control terminal and said second control terminal, for coupling said first control terminal to said second control terminal in response to said output potential, said switching stage having a third switch as a PMOS transistor having a source, a drain and a gate as a third control terminal coupled to said output terminal, said third switch being coupled between said first control terminal and said second control terminal, and a fourth switch as an NMOS transistor having a source, a drain and a gate as a fourth control terminal coupled to said output terminal, said fourth switch being coupled between said first control terminal and said second control terminal in parallel with said third switch;

wherein the source of said first switch is coupled to said high potential terminal, and the drain of said first switch is coupled to said output terminal;

wherein the source of said second switch is coupled to said low potential terminal, and the drain of said second switch is coupled to said output terminal;

wherein the source of said third switch is coupled to said first control terminal, and the drain of said third switch is coupled to said second control terminal; and wherein the source of said fourth switch is coupled to said second control terminal, and the drain of said fourth switch is coupled to said first control terminal.

15. The output buffer circuit of claim 14, further comprising:
a control input terminal;
wherein said switching stage also includes:
a fifth switch as a PMOS transistor coupled in series with said third switch and in parallel with said fourth switch between said first control terminal and said second control terminal, having a fifth control terminal coupled to said control input terminal; and
a sixth switch as an NMOS transistor coupled in series with said fourth switch and in parallel with said third switch between said first control terminal and said second control terminal, having a sixth control terminal coupled to said control input terminal.

16. The output buffer circuit of claim 15, wherein said fifth switch has a source, a drain and a gate as the fifth control terminal, the source of said fifth switch is coupled to said first control terminal, and the drain of said fifth switch is coupled to said second control terminal via said third switch; and
said sixth switch has a source, a drain and a gate as the sixth control terminal, the source of said sixth switch is coupled to said second control terminal, and the drain of said sixth switch is coupled to said first control terminal via said fourth switch.

17. A buffer circuit of claim 14, wherein the control circuit has a P channel type MOS transistor having a drain connected to the first control terminal, a source connected to the high potential terminal and a gate connected to said input terminal and an N channel type MOS transistor having a drain connected to the second control terminal, a source connected to the low potential terminal and a gate connected to said input terminal.

18. A buffer circuit of claim 14, wherein the control circuit has a P channel type MOS transistor having a drain connected to the first control terminal, a source connected to the high potential terminal and a gate connected to said control input terminal and an N channel type MOS transistor having a drain connected to the second control terminal, a source connected to the low potential and a gate connected to said control input terminal.

* * * * *